(12) United States Patent
Kozin et al.

(10) Patent No.: US 8,592,738 B1
(45) Date of Patent: Nov. 26, 2013

(54) ALIGNMENT DEVICE FOR USE WITH A SOLAR TRACKING PHOTOVOLTAIC ARRAY

(75) Inventors: Igor Kozin, Princeton, NJ (US); James Sherman, Hillsborough, NJ (US)

(73) Assignee: Suncore Photovoltaics, Inc., Irwindale, CA (US)

( * ) Notice: Subject to any disclaimer, the term of this patent is extended or adjusted under 35 U.S.C. 154(b) by 385 days.

(21) Appl. No.: 12/828,734

(22) Filed: Jul. 1, 2010

(51) Int. Cl.
*G01C 21/02* (2006.01)
*F24J 2/38* (2006.01)
*H02N 6/00* (2006.01)

(52) U.S. Cl.
USPC .................. 250/203.4; 126/573; 136/246

(58) Field of Classification Search
USPC ........ 250/203.4; 136/246, 251, 259; 126/576, 126/605, 684, 573
See application file for complete search history.

(56) References Cited

U.S. PATENT DOCUMENTS

| | | | |
|---|---|---|---|
| 4,016,590 A * | 4/1977 | Baur et al. | 257/428 |
| 4,031,385 A | 6/1977 | Zerlaut et al. | |
| 4,133,501 A | 1/1979 | Pentlicki | |
| 4,172,739 A | 10/1979 | Tassen | |
| 4,188,238 A * | 2/1980 | Boling | 136/247 |
| 4,225,781 A * | 9/1980 | Hammons | 250/203.4 |
| 4,345,582 A | 8/1982 | Aharon | |
| 4,425,904 A | 1/1984 | Butler | |
| 4,440,465 A | 4/1984 | Elliot et al. | |
| 4,471,222 A * | 9/1984 | Fowler et al. | 250/350 |
| 4,585,318 A | 4/1986 | Seifert | |
| 4,586,488 A | 5/1986 | Noto | |
| 4,628,142 A | 12/1986 | Hashizume | |
| 4,672,191 A * | 6/1987 | Cofield | 250/203.4 |
| 4,832,001 A | 5/1989 | Baer | |
| 4,989,124 A | 1/1991 | Shappell | |
| 4,995,377 A | 2/1991 | Eiden | |
| 5,169,456 A | 12/1992 | Johnson | |
| 5,600,124 A | 2/1997 | Berger | |

(Continued)

FOREIGN PATENT DOCUMENTS

DE 10 2004 018151 A1 10/2005
DE 20 2006 003476 U1 12/2006

(Continued)

OTHER PUBLICATIONS

Position Sensing Detector (PSD) descriptive information. http://www.thorlabs.com/. 7 pages. Thorlabs, Newton, NJ.

(Continued)

*Primary Examiner* — Georgia Y Epps
*Assistant Examiner* — Don Williams
(74) *Attorney, Agent, or Firm* — Mueting, Raasch & Gebhardt, P.A.

(57) ABSTRACT

An alignment device for aligning solar cell modules of a solar tracking photovoltaic array relative to the sun. The alignment device may be mounted on at least one planar solar cell module so that an axis of the device is substantially perpendicular to the planar surface of the module. The device may include a convex lens at one end for focusing incoming rays of the sun into a focused beam, and a planar photodetector at a second end positioned so that the focused beam aligns on a predetermined point of the photodetector when the modules are correctly aligned. The instrument may also include a plurality of leads attached to the photodetector to provide a signal indicative of an angular misalignment of the at least one module.

20 Claims, 10 Drawing Sheets

(56) References Cited

U.S. PATENT DOCUMENTS

| | | | |
|---|---|---|---|
| 5,798,517 A | 8/1998 | Berger | |
| 6,005,236 A | 12/1999 | Phelan et al. | |
| 6,058,930 A | 5/2000 | Shingleton | |
| 6,079,408 A | 6/2000 | Fukuda | |
| 6,123,067 A | 9/2000 | Warrick | |
| 6,465,725 B1 | 10/2002 | Shibata et al. | |
| 6,485,152 B2* | 11/2002 | Wood | 359/853 |
| 6,552,257 B1 | 4/2003 | Hart et al. | |
| 6,563,040 B2 | 5/2003 | Hayden et al. | |
| 6,722,357 B2 | 4/2004 | Shingleton | |
| 6,960,717 B2 | 11/2005 | Stuart et al. | |
| 7,252,084 B2 | 8/2007 | Pawlenko et al. | |
| 7,381,886 B1 | 6/2008 | Aiken et al. | |
| 7,531,741 B1 | 5/2009 | Melton et al. | |
| 7,795,568 B2 | 9/2010 | Sherman | |
| 7,836,879 B2 | 11/2010 | Mackamul | |
| 8,188,413 B2 | 5/2012 | Kats et al. | |
| 8,188,415 B2 | 5/2012 | Kats et al. | |
| 2003/0172922 A1 | 9/2003 | Haber | |
| 2004/0112373 A1 | 6/2004 | Djeu | |
| 2007/0089777 A1 | 4/2007 | Johnson, Jr. et al. | |
| 2007/0091594 A1* | 4/2007 | Soon | 362/183 |
| 2007/0101738 A1 | 5/2007 | Akei et al. | |
| 2007/0188876 A1 | 8/2007 | Hines et al. | |
| 2007/0193620 A1 | 8/2007 | Hines et al. | |
| 2008/0029151 A1 | 2/2008 | McGlynn et al. | |
| 2008/0128586 A1 | 6/2008 | Johnson et al. | |
| 2008/0135087 A1 | 6/2008 | Anikara | |
| 2008/0178867 A1 | 7/2008 | DiDomenico | |
| 2008/0236567 A1 | 10/2008 | Hayden | |
| 2008/0258051 A1 | 10/2008 | Heredia et al. | |
| 2009/0000662 A1 | 1/2009 | Harwood et al. | |
| 2009/0032014 A1 | 2/2009 | Meydbray | |
| 2009/0032084 A1 | 2/2009 | Aiken et al. | |
| 2009/0032086 A1 | 2/2009 | Kats et al. | |
| 2009/0032090 A1 | 2/2009 | Kats et al. | |
| 2009/0199890 A1 | 8/2009 | Hering et al. | |
| 2010/0011565 A1 | 1/2010 | Zawadzki et al. | |
| 2010/0018570 A1 | 1/2010 | Cashion et al. | |
| 2010/0032004 A1 | 2/2010 | Baker et al. | |
| 2010/0101625 A1 | 4/2010 | Kats et al. | |
| 2010/0101630 A1 | 4/2010 | Kats et al. | |
| 2010/0101632 A1 | 4/2010 | Kats et al. | |
| 2010/0102200 A1 | 4/2010 | Kats et al. | |
| 2010/0102202 A1 | 4/2010 | Sherman | |
| 2010/0108860 A1 | 5/2010 | Sherman et al. | |
| 2010/0236603 A1* | 9/2010 | Menard et al. | 136/246 |
| 2010/0258110 A1 | 10/2010 | Krabbe et al. | |
| 2010/0294337 A1 | 11/2010 | Sherman et al. | |
| 2011/0289750 A1 | 12/2011 | Kats et al. | |
| 2012/0160991 A1 | 6/2012 | Kats et al. | |

FOREIGN PATENT DOCUMENTS

| | | |
|---|---|---|
| ES | 2268938 A1 | 3/2007 |
| JP | 2000196127 | 7/2000 |
| JP | 2000223730 | 8/2000 |
| JP | 2002202817 | 7/2002 |
| WO | WO 01/55651 A1 | 8/2001 |
| WO | WO 02079793 | 10/2002 |
| WO | WO 2008/008023 A1 | 1/2008 |
| WO | WO 2008/090241 A1 | 7/2008 |
| WO | WO 2008/154945 A1 | 12/2008 |
| WO | WO 2009/048879 | 4/2009 |

OTHER PUBLICATIONS

"PDP90A Product Specification Sheet." http://www.thorlabs.com/. 3 pages. Thorlabs, Newton, NJ.

U.S. Appl. No. 12/791,580, filed Jun. 1, 2010, Kats et al.

U.S. Appl. No. 12/828,734, filed Jul. 1, 2010, Kozin.

U.S. Appl. No. 12/830,926, filed Jul. 6, 2010, Sherman.

Picture of GE Concentrator Array, Circa 1983, Sandia.

Luque, A. and Hegedus, S., eds. Handbook of Photovoltaic Science and Engineering. Wiley: Hoboken, NJ. 2003. Sections 9.8 and 9.9 and Chapter 11. 64 pages total. ISBN 1591247748. Ebook accessed through North Carolina State University Libraries. http://catalog.lib.ncsu.edu/web2/tramp2.exe/goto/A1hl1rqi.002?screen=Record.html&server=1home&item=3.

"Concentrating PV module and system developers." Photon International: The Photovoltaic Magazine. Aug. 2009. pp. 134-137. PHOTON Europe GmbH, Aachen, Germany.

"WS T 1600—the world wide connected solar tracker." Data Sheet, 2 pages. www.ws-energia.com. WS Energia Lda, Oeiras, Portugal.

"WS T 1600—the world wide connected solar tracker." Data Sheet, 3 pages. www.ws-energia.com. WS Energia Lda, Oeiras, Portugal.

WS T1000. Data Sheet, 2 pages. www.ws-energia.com. WS Energia Lda, Oeiras, Portugal.

"170 Watt NE-170UC1." Data Sheet, 2 pages. Sharp.co.jp. Sharp Electronics Corp., Huntington Beach, CA.

OPEL SF-4M Roof Top Tracker. Data Sheet, 2 pages. www.opelinc.com. OPEL Solar Inc. Shelton, CT.

"FEiNA SF-4 Mini Tracker." Data Sheet, 2 pages. www.opelinc.com. OPEL Solar Inc. Shelton, CT.

SF-40 H1 Rooftop Tracker. Data Sheet, 2 pages. www.opelinc.com. OPEL Solar Inc. Shelton, CT.

"OPEL TF-800 Single Axis Tracker." Data Sheet, 2 pages. www.opelinc.com. OPEL Solar Inc. Shelton, CT.

"FEiNA Sf-9 Dual Axis Tracker." Data Sheet, 2 pages. www.opelinc.com. OPEL Solar Inc. Shelton, CT.

"FEiNA SF-20 Dual Axis Tracker." Data Sheet, 2 pages. www.opelinc.com. OPEL Solar Inc. Shelton, CT.

"OPEL SF-20 CPV Dual Axis Tracker." Data Sheet, 2 pages. www.opelinc.com. OPEL Solar Inc. Shelton, CT.

"TF-500 Dual Axis Tracker." Data Sheet, 2 pages. www.opelinc.com. OPEL Solar Inc. Shelton, CT.

"Mk-ld High Concentration Photovoltaic Panel (HCPV)." Data Sheet, 2 pages. www.opelinc.com. OPEL Solar Inc. Shelton, CT.

"PS140 Solar Concentrator." Data Sheet, 2 pages. www.power-spar.com. Power-Spar, Markham, Ontario, Canada.

Fraas, L., et al., "Start-Up of First 100 kW System in Shanghai with 3-Sun PV Mirror Modules." 4 pages. Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA.

Fraas, L., et al., "Test Sites and Testing of 3-Sun Mirror Modules." 4 pages. Presented at IEEE 4th World Conference on Photovoltaic Energy Conversion, Waikoloa, Hawaii, May 9, 2006. Jxcrystals.com. JX Crystals, Inc., Issaquah, WA.

"SunCube Specifications." Data Sheet, 4 pages. www.greenandgoldenergy.com.au. Green and Gold Energy Pty. Ltd., Glynde, Australia.

"Sunflower Fully-Integrated, Smart HCPV." Data Sheet, 2 pages. www.energyinnovations.com. Energy Innovations, Poway, CA.

"Kinematics stewing drives" Product description. 1 page. www.kinematicsmfg.com/Products/slewing-drives.aspx. Kinematics Manufacturing, Inc. Phoenix, AZ.

"Slewing Drives S7b-73m-32ra." Data Sheet, 2 pages. www.kinematicsmfg.com/Products/slewing-drives/SlewingDrivesProducts/Slewing-Drives-S7B-73M-32RA.aspx. Kinematics Manufacturing, Inc. Phoenix, AZ.

"Laser welding of plastics. Innovative and flexible." Brochure. http://www.leister.com/uploads/pdf/en/leister_laser_eng.pdf. Sep. 2007. Leister Process Technologies. Kaegiswil, Switzerland. (12 pages).

"GLOBO-welding. Laser welding of plastics—innovative and flexible. The universal processing concept for 3D and continuous applications," Brochure. http://www.leister.com/uploads/pdf/en/BRO_GLOBO_Welding_dv092006_ENG.pdf. Sep. 2006. Leister Process Technologies. Kaegiswil, Switzerland. (4 pages).

"Shop SABRE, a N.A.C.S.I Company. 'The Way CNC Was Meant to Be.'" Laser Product Information. http://www.shopsabre.com/Laser%20Page.html. No date of web publication given. Shop SABRE. Elko, Minnesota, USA. (4 pages).

* cited by examiner

ALIGNMENT DEVICE FOR USE WITH A SOLAR TRACKING PHOTOVOLTAIC ARRAY

RELATED APPLICATIONS

The present application is related to U.S. patent application Ser. No. 12/623,134 filed on Nov. 20, 2009.

The present application is related to U.S. patent application Ser. No. 12/574,508 filed Oct. 6, 2009.

The present application is related to U.S. patent application Ser. No. 12/478,567 filed Jun. 4, 2009.

The present application is related to U.S. patent application Ser. No. 12/257,670 filed Oct. 24, 2008.

BACKGROUND

The present application is directed to a solar tracking photovoltaic array and, more particularly, to an alignment device for maintaining the alignment of the array with the sun.

Solar tracking photovoltaic arrays are used for various applications. The arrays are designed for a specific output capacity that may vary from being relatively small, such as a few kilowatts, to relatively large in excess of hundreds of kilowatts. The arrays may be installed at various locations that have exposure to the sun for adequate periods of time to produce the required power capacity.

The arrays generally include a frame with one or more solar cell modules in the form of panels. The frame may be adjustable to position the solar cell modules towards the sun. The frame may adjust the position of the solar cell modules throughout the day and throughout the year to ensure they remain directed to the sun to maximize the power capacity.

In some instances, the arrays become misaligned with the sun. This may be caused by a variety of reasons, including but not limited to weather conditions (e.g., high winds, snow, ice), worn equipments, and improper programming. Improper alignment of the arrays results in a decrease in the output capacity. The arrays should be equipped to maintain the solar cell modules accurately aligned towards the sun to maximize the output capacity.

SUMMARY

The present application is directed to assemblies for aligning a solar tracking photovoltaic system relative to the sun. In some embodiments of the present invention, an alignment test instrument includes an alignment device mounted on at least one planar solar cell module so that an axis of the device is substantially perpendicular to the planar surface of the module. The device may include a convex lens at one end for focusing incoming rays of the sun into a focused beam, and a planar photodetector at a second end positioned so that the focused beam aligns on a predetermined point of the photodetector when the modules are correctly aligned. The instrument may also include a plurality of leads attached to the photodetector to provide a signal indicative of an angular misalignment of the at least one module.

In some embodiments of the present invention, a portable alignment assembly is constructed for use with a solar cell module that has a planar surface. The alignment assembly may include a housing with a base and an elongated tube that extends outward from the base and terminates at a distal end. The tube may include a longitudinal axis that extends through the distal end. A first lens may be positioned at the distal end of the tube to focus incoming rays of sun into a focused beam. A planar detector may be positioned within the housing and aligned with the longitudinal axis of the tube to receive the focused beam. A plurality of leads may be attached to the planar detector with each of the plurality of leads generating a signal indicative of a position of the focused beam on the planar detector. A controller may be positioned within the housing and operatively connected to the plurality of leads. The controller may be configured to analyze the signals generated by each of the plurality of leads and determine a location of incidence of the focused beam on the planar detector. A display may be associated with the housing and operatively connected to the controller to display information concerning the location of incidence of the focused beam on the planar detector. A battery may be positioned within the housing to supply power to at least the planar detector, the controller, and the display.

The present application also includes a terrestrial solar tracking photovoltaic array that includes a torque tube extending over the surface of the earth, a first drive operatively connected to the torque tube to rotate the torque tube, and vertical supports that each include a first end configured to contact against a support surface. The torque tube may be journaled for rotation at a second end of the vertical supports. The array may also include at least one solar cell module pivotally coupled to the torque tube to allow the modules to track the sun during the course of the day. The modules may include a planar surface. The array may also include a sun alignment sensor coupled to at least one of the solar cell modules to determine an angular displacement of the planar surface of the solar cell module with respect to incoming beams from the sun.

Some implementations or embodiments may incorporate or implement fewer of the aspects or features noted in the foregoing summaries.

DETAILED DESCRIPTION

Figure 1:
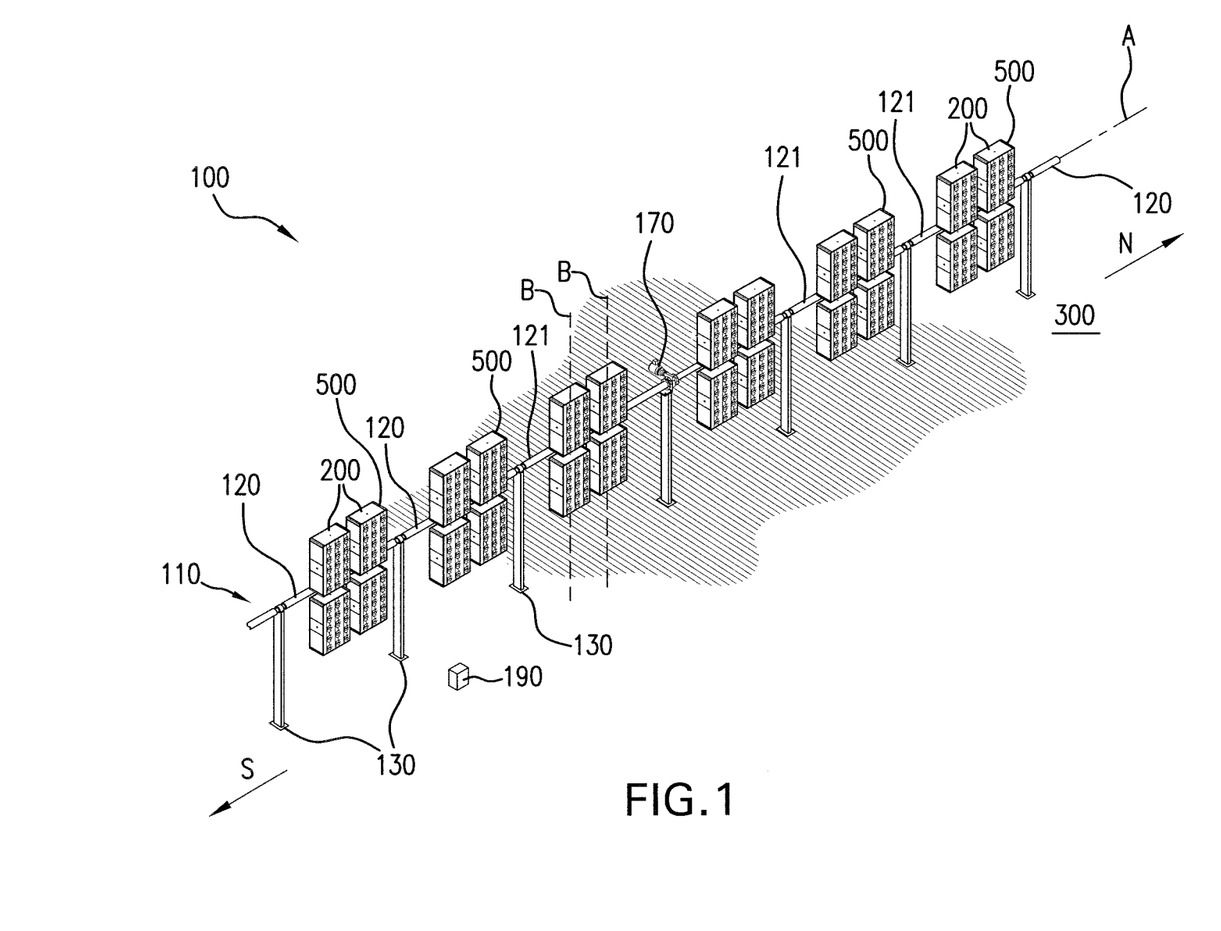
FIG. 1 is a perspective view of a terrestrial photovoltaic solar cell tracking array according to some embodiments of the present invention.

The present application is directed to a photovoltaic solar cell array with one or more alignment devices to maintain alignment of one or more solar cell modules with the sun. FIG. 1 illustrates an embodiment of a photovoltaic solar cell array generally illustrated as element 100. The array 100 includes an elongated frame 110 configured to mount one or more solar cell modules 200. According to some embodiments with multiple modules 200, the modules 200 are positioned in a longitudinally-extending and spaced-apart arrangement. The frame 110 is able to rotate each of the solar cell modules 200 along a first axis A to simultaneously track the elevation of the sun during the course of a day. The frame 110 is able to rotate each solar cell module 200 along axes B that are substantially perpendicular to axis A to track the azimuthal position of the sun during the course of the day. One or more alignment assemblies 500 detect the position of the solar cell modules 200 relative to the sun. The array 100 is configured to adjust the position of one or more of the solar cell modules 200 relative to the position determination of the one or more alignment assemblies 500. The position of the one or more solar cell modules 200 may be along one or both of the A and B axes.

Frame 110 positions the one or more solar cell modules 200 to track the movement of the sun. Frame 110 includes a torque tube 120 that is positioned above a surface 300 by spaced-apart vertical supports 130. In one embodiment, the torque tube 120 is a single continuous piece. In one specific embodiment, the torque tube 120 is a pipe with a diameter of about 4-5.63 inches and includes a thickness of about 0.167-0.188 inches. The pipe has a length of about 170" and weighs about 110 lbs.

In another embodiment, the torque tube 120 may be constructed from a number of discrete sections 121 that are connected together in an end-to-end arrangement. The lengths and construction of each section 121 may be the same or may be different. In one embodiment, each section 121 is sized to one or more solar cell modules 200. The modular design provides for a user to construct the torque tube 120 to a length needed to support a necessary number of solar cell modules 200. Sections 121 may be added to an existing frame 110 to accommodate additional solar cell modules 200 as is necessary for the array 100 to produce the desired power output.

Figure 2:
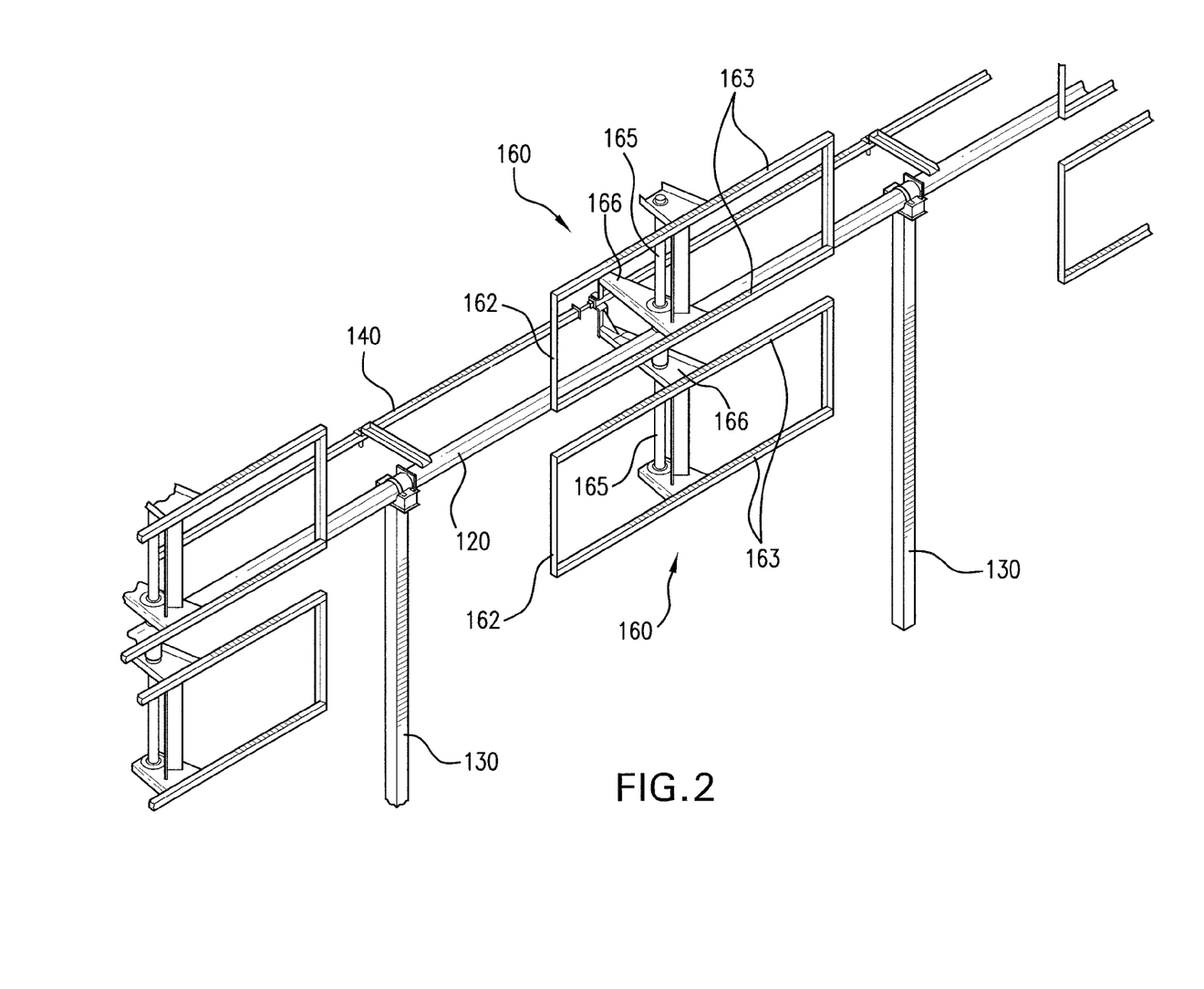
FIG. 2 is a perspective view of a section of a frame of an array according to some embodiments of the present invention.

As illustrated in FIG. 2, mounts 160 support the solar cell modules 200 and are connected to the torque tube 120. The mounts 160 may include vertical members 162 and horizontal members 163 that support the solar cell modules 200. Mounts 160 may be of different sizes to accommodate different numbers of solar cell modules 200. Mounts 160 may also include a pivot member 165 that facilitates pivoting motion of the solar cell modules 200 about the second axes B. The pivot member 165 may be a single elongated member or may be constructed of separate members that are positioned in an end-to-end orientation and connected at the torque tube 120.

Figure 3:
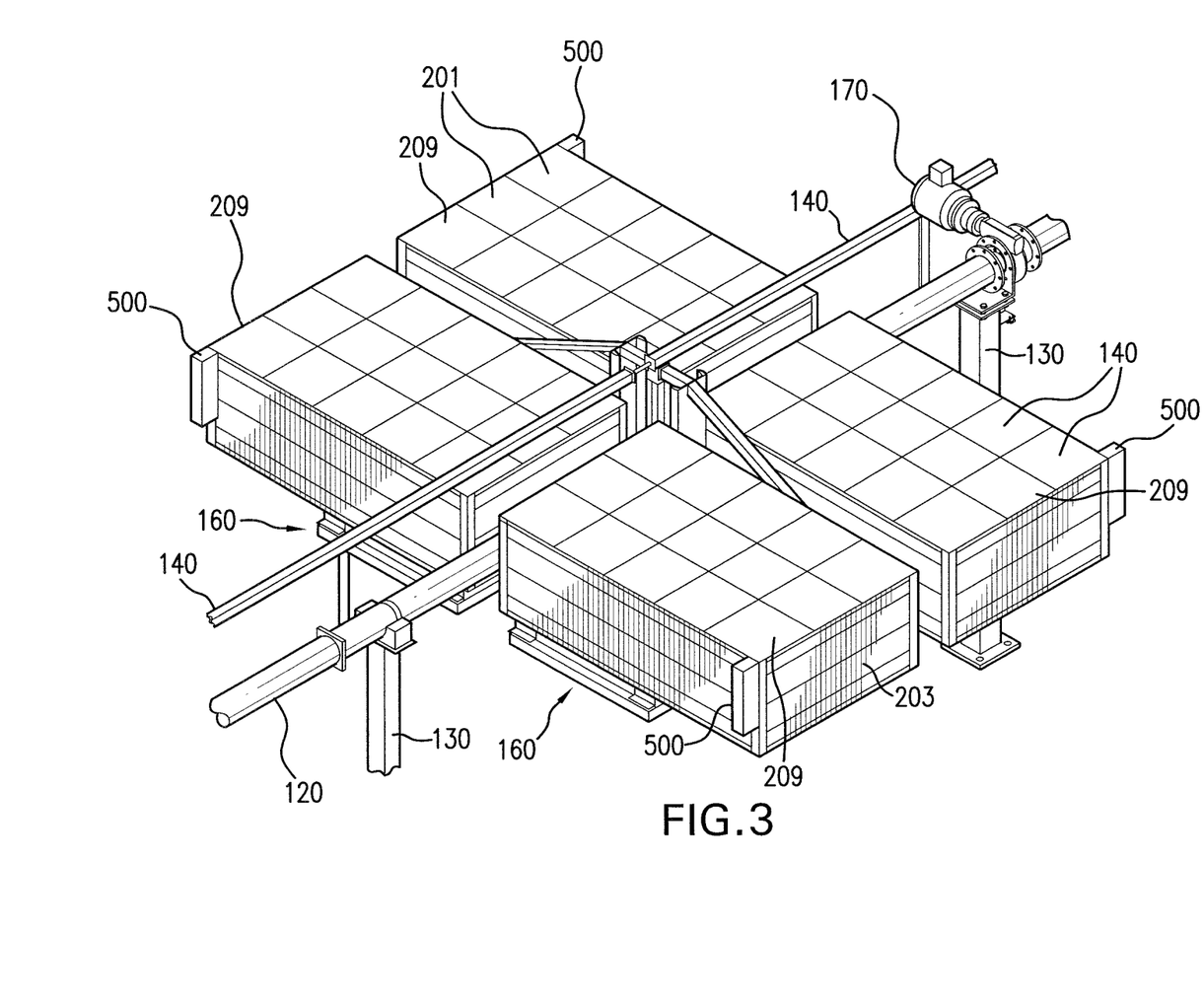
FIG. 3 is a perspective view of a section of an array with two pairs of modules attached to a frame according to some embodiments of the present invention.

The mounts 160 may be positioned at various spacings along the length of the torque tube 120. The mounts 160 may be aligned along the torque tube 120 in offsetting pairs on opposing sides of the torque tube 120 directly across from one another as illustrated in FIGS. 1 and 3. Other offset positioning may include the mounts 160 unevenly spread along the length with equal numbers of mounts 160 extending outward from each opposing side of the torque tube 120. The offset positioning assists to balance the array 100 and facilitate rotation about the first axis A. Other configurations may include uneven numbers of mounts 160 extending outward from the opposing sides of the torque tube 120. According to some embodiments, a single solar cell module 200 extends from the torque tube 120.

The vertical supports 130 are spaced apart along the length of the torque tube 120. The vertical supports 130 include a length adequate to position the solar cell modules 120 above the surface 300 for rotation about the first axis A. Therefore, the vertical supports 130 are longer than a height of the mounts 160 and the solar cell modules 200.

The vertical supports 130 are positioned along the torque tube 120 away from the mounts 160 to prevent interference with the movement of the solar cell modules 200. As illustrated in FIG. 1, the vertical supports 130 are spaced-apart from the solar cell modules 200 along the length of the torque tube 120. In this arrangement, the vertical supports 130 are in a non-overlapping arrangement with the solar cell modules 200. Various numbers of vertical supports 130 may be positioned along the length of the torque tube 120. In the embodiment of FIG. 1, a vertical support 130 is positioned between each pair of mounts 160. In other embodiments, the vertical supports 130 are spaced a greater distance apart along the torque tube 120. In one specific embodiment, the vertical supports 130 include a 4 inch by 4 inch rectangular shape, and include a thickness of about 0.188 inches. The vertical supports 130 may also be supported in a concrete pad.

One or more drives 170 are connected to the torque tube 120 to provide a force to rotate the torque tube 120 about axis A. According to some embodiments of the present invention, drive 170 may be positioned at an end of the torque tube 120. Drive 170 may include a drive train with one or more gears that engage with the torque tube 120. According to some embodiments of the present invention, a drive 170 is positioned at a center of the torque tube along axis A.

The array 100 is constructed to facilitate rotation of the torque tube 120 about the first axis A. The array 100 is designed to balance the power load requirements of the one or more drives 170 during rotation through the various angular positions about the first axis A. One manner of balancing the load requirements is placing the mounts 160 and solar cell modules 200 such that a center of gravity of the array 100 is aligned with the torque tube 120. FIGS. 1 and 3 each illustrate examples of this positioning with equal numbers of mounts 160 and solar cell modules 200 extending outward from the opposing sides of the torque tube 120. FIGS. 1 and 2 illustrate the mounts 160 and solar cell modules 200 aligned in pairs that are directly across the torque tube 120 from each other. Other spacings of the mounts 160 and solar cell modules 200 may also be used for balancing the load requirements. The balanced system maintains a near constant potential energy as rotation in a first direction is facilitated by the weight of the mounts 160 and solar cell modules 200 that extend outward from a first side, and rotation in a second direction is facilitated by the opposing mounts 160 and solar cells 200 that extend outward from a second side of the torque tube 120.

One or more couplings 166 are attached to each mount 160 to enable the mount 160 and attached solar cell modules 200 to rotate about the second axis B. According to some embodiments as illustrated in FIG. 2, couplings 166 include first and second arms that are positioned on opposing sides of the torque tube 120. The couplings 166 are further connected to rotate about the first axis A during rotation of the torque tube 120.

Figure 4:
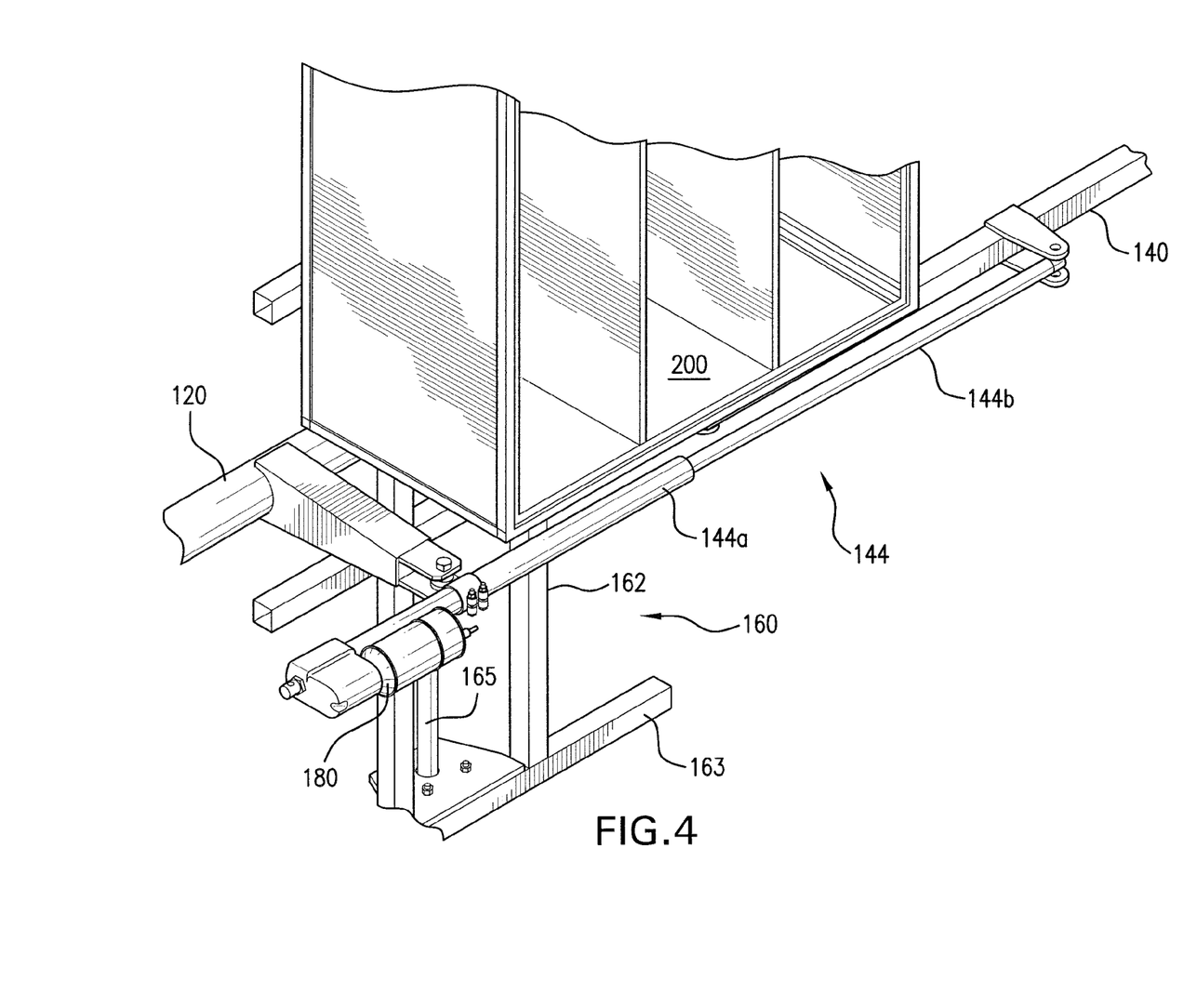
FIG. 4 is a perspective view of a drive and a section of a linkage assembly according to some embodiments of the present invention.

Linkages 140 are connected to the mounts 160 for rotating the solar cell modules 200 about the second axes B. The linkages 140 are attached together in a string aligned substantially parallel to the torque tube 120. A drive 180 is attached to the linkages 140 as illustrated in FIG. 4 and includes a drive linkage 144. The drive linkage 144 includes a first section 144a operatively connected to the drive 180, and a telescoping second section 144b operatively connected to the linkage 140. The drive 180 provides a force for moving the drive linkage 144 and the attached linkages 140 and thus pivoting the solar cell modules 200 about the second axes B. The number of linkages 140 in the string that is moved by the drive 180 and the drive linkage 144 may vary depending upon the context of use. According to some embodiments of the present invention, one or more additional drives 180 are positioned along the linkage string that work in combination with the drive 180 to move the linkages 140.

U.S. patent Publication Ser. No. 12/574,508 filed Oct. 6, 2009 discloses embodiments of a solar cell array module with a frame for rotating solar cell modules about two axes and is herein incorporated by reference in its entirety.

Figure 5:
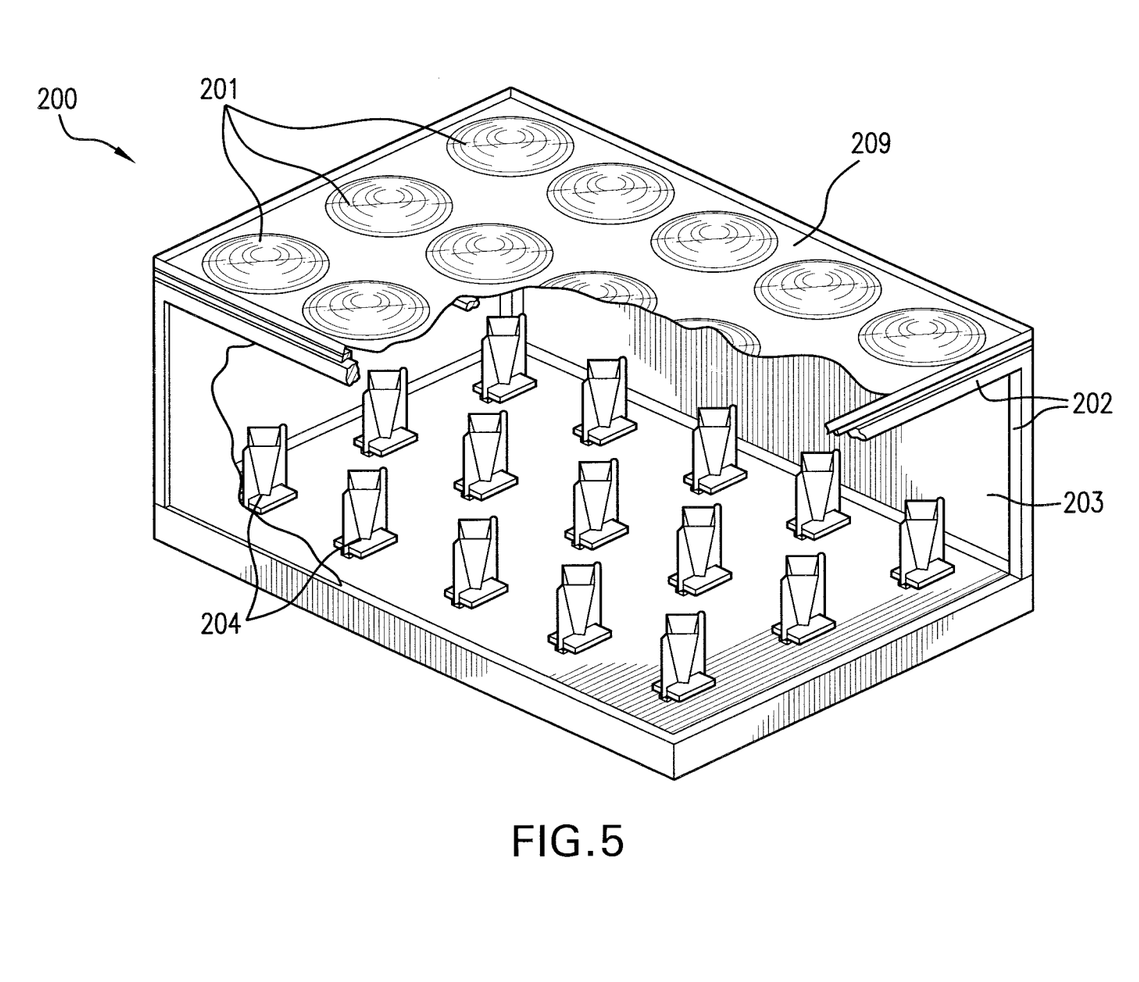
FIG. 5 is a cut-away perspective view of a solar cell module according to some embodiments of the present invention.

The solar cell modules 200 are configured to convert the sun light into electrical energy. According to some embodiments of the present invention as illustrated in FIG. 5, the solar cell modules 200 are each about 43" by 67". The solar cell module 200 may include an aluminum frame 202 and plastic or corrugated plastic sides 203 that reduce the overall weight to about 70 pounds. In one embodiment, each solar cell module 200 includes a planar upper surface 209 that includes an array of lenses 201 that are positioned over corresponding receivers 204. According to some embodiments of the present invention, the modules 200 include a 3×5 array of lenses as illustrated in FIG. 5. Other embodiments may include different numbers and/or arrangements of the lenses 201. In one specific embodiment, the module 200 includes a single lens 201. The lenses 201 may include various shapes and sizes with one specific embodiment including lenses that are about 13" square. Further, the focal length between the lenses 201 and the receivers 204 is about 20". Each receiver 204 may include one or more III-V compound semiconductor solar cells.

When mounted on the surface 300, the torque tube 120 may be positioned in a north N-south S orientation as illustrated in FIG. 1. In one embodiment, the surface 300 is the surface of the Earth. The torque tube 120 includes a length to space a desired number of solar cell modules 200. Throughout the course of the day, the array 100 is adjusted to maintain the solar cell modules 200 facing towards the sun. The drive 170 may be periodically activated to provide a force to rotate the torque tube 120 and hence each of the mounts 160 and attached solar cell modules 200. According to some embodiments of the present invention, the force applied by the drive 170 provides for each of the solar cells receivers 200 to be moved a same amount such that each solar cell array module 200 is synchronized and moved in unison.

In addition to the rotation of the torque tube 120, the one or more drives 180 moves the linkages 140 to further maintain the solar cell modules 200 aligned with the sun. The one or more drives 180 are periodically activated to move the drive linkages 144 and attached string of linkages 140. This movement causes the attached mounts 160 and solar cell modules 200 to pivot about the various axes B. These axes B may be orthogonal to the axis A. The string of linkages 140 provides for each of the solar cell modules 200 to again move in unison about their respective axis B. The movement about the B axes may allow the solar cell modules 200 to track the azimuthal position of the sun during the course of the day.

A controller 190 as schematically illustrated in FIG. 1 may control the movement of one or more arrays 100 and the positioning the modules 200 relative to the sun. The controller 190 may include a microcontroller with associated memory. In one embodiment, controller 190 includes a microprocessor, random access memory, read only memory, and in input/output interface. The controller 190 controls operation of the one or more drives 170 for rotating the torque tube 120 and the solar cell modules 200 about the first axis A. The controller 190 further controls the one or more drives 180 for driving the linkages 140 and rotating the solar cell modules about the second axes B. The controller 190 may include an internal timing mechanism such that the operation of the drives corresponds to the day and the time for the solar cell modules 200 to track the azimuth and elevation of the sun.

The solar cell array 100 is constructed in a manner to eliminate or minimize shadowing problems between solar cell modules 200. In one embodiment, the torque tube 120 and the individual sections 121 of the solar cell modules 200 are sized to space apart each module 200 such that it is fully illuminated for positions where the sun is 15° above the horizon, and that there is no shadowing of any given module 200 by any other module 200.

U.S. Pat. No. 7,381,886 assigned to Emcore Corporation discloses solar cell arrays and positioning relative to the sun path and is herein incorporated by reference in its entirety.

Figure 6:
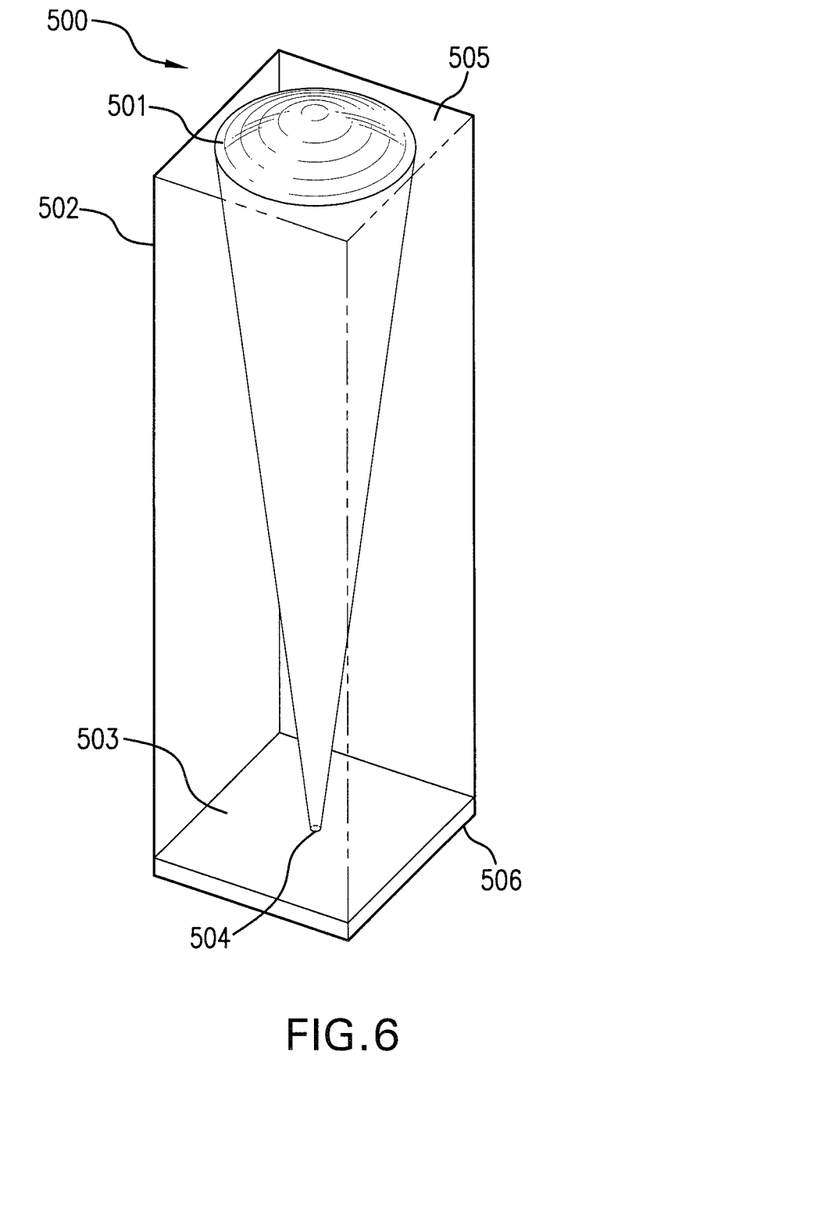
FIG. 6 is a schematic perspective view of an alignment assembly according to some embodiments of the present invention.

One or more alignment assemblies 500 are positioned on the array 100 to maintain the one or more modules 200 aligned with the sun. The alignment assemblies 500 determine an angular displacement of the planar surface 209 of the module 200 with respect to incoming beams from the sun. FIG. 6 illustrates an alignment assembly 500 according to some embodiments of the present invention that includes a body 502 with a first end 505 and a second end 506. The body 502 includes an elongated shape with a longitudinal axis that extends through each of the ends 505, 506. The alignment assembly 500 further includes a lens 501 and a photodetector 503. According to some embodiments of the present invention, the lens 501 is positioned at the first end 505 of the body 502. The lens 501 may also be positioned inward from the first end 505. The photodetector 503 may be positioned at the second end 506, or inward from the second end 506. The lens 501 and the photodetector 503 may each be aligned perpendicular to a longitudinal axis of the body 502.

The lens 501 focuses a beam onto the photodetector 503. According to some embodiments, the lens 501 is a convex lens 501. The lens 501 may include a variety of cross-sectional shapes perpendicular to the longitudinal axis, including circular as illustrated in FIG. 6. According to some embodiments of the present invention, the lens 501 is positioned away from the photodetector 503 a distance equal to a focal length of the lens 501. In other embodiments, the distance is different than the focal length. According to some embodiments of the present invention, the lens 501 is a complex lens such as a camera lens or an achromatic lens. The complex lens 501 reduces the influence of achromatic distortions to reduce the size of the light spot on the location of incidence 504 and increase the accuracy.

The photodetector 503 has a planar surface that receives the focused light beam from the lens 501. According to some embodiments of the present invention, the photodetector 503 includes a PN or PIN junction for generating a photocurrent responsive to the focused light beam striking the photodetector 503. An electric charge proportional to the intensity of the focused light beam is generated at the location of incidence 504. The location of incidence 504 can be detected by providing an electrode 509 at each corner A, B, C, and D of the photodetector 503 and analyzing each electrode signal. The electric charge generated by the photodetector 503 is carried from the location of incidence 504 through an active region of the photodetector 503 such as a p-type layer and collected by each of the electrodes 509 positioned at the corners of the photodetector 503. The electric charge is divided in inverse proportion to the distance between the location of incidence 504 and each electrode 509 due to the resistance of the active region of the photodetector 503.

Figure 7A:
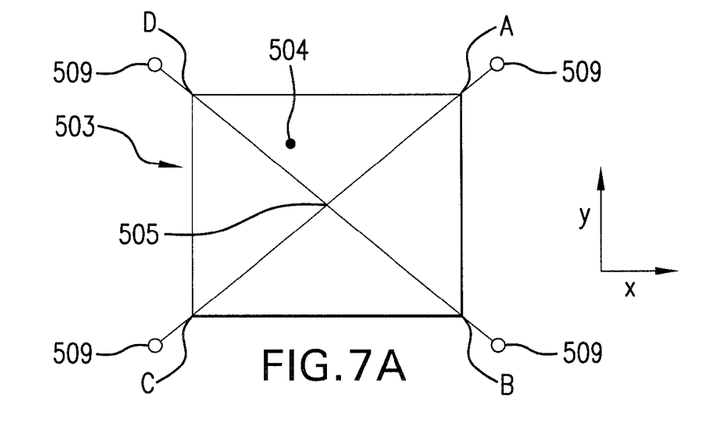
FIGS. 7A-7C are schematic illustrations of points of incidence of a focused light beam on a photodetector according to some embodiments of the present invention.
Figure 7B:
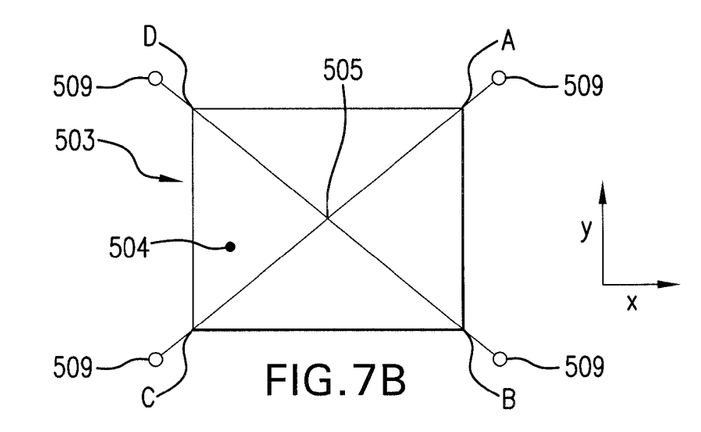
Figure 7C:
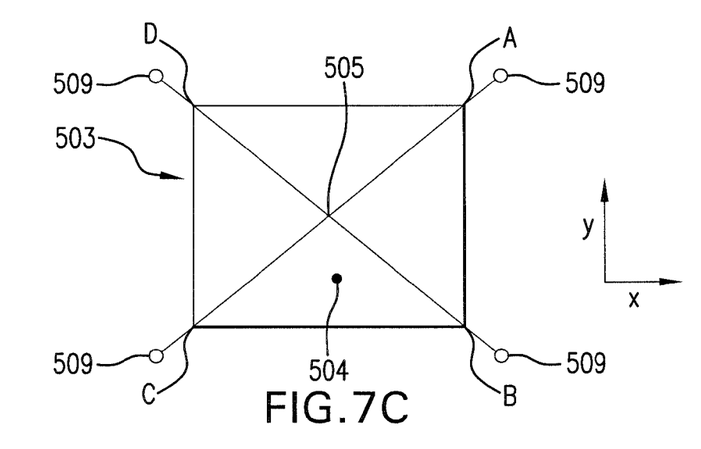

The X and Y coordinates for the location of incidence 504 can be determined by analyzing the signals (the current and/or voltage) at each electrode 509 e.g. using well-known linear equations. If the location of incidence 504 is at the center 505 of the photodetector 503 (i.e. the X-Y offset is negligible), each electrode 509 yields the same signal. However, if the location of incidence 504 is offset from the photodetector center 505 in either the X or Y direction, the signals from the electrodes 509 yield different magnitudes. For example, if the location of incidence 504 is offset as shown in FIG. 7A, the electrode 509 at corner D generates the signal with the largest amplitude followed by the electrode 509 at corner A, the electrode at corner C and the electrode 509 at corner B. If the location of incidence 504 is as shown in FIG. 7B, the electrode 509 at corner C generates the signal with the largest amplitude followed by the electrode 509 at corner D, the electrode 509 at corner B and the electrode 509 at corner A. In yet another example, if the location of incidence 504 is as shown FIG. 7C, the electrode 509 at corner B generates the signal with the largest amplitude followed by the electrode 509 at corner C, the electrode 509 at corner A and the electrode 509 at corner D. The difference in signal magnitudes can be analyzed to determine the X-Y offset of the location of incidence 504 from the center 505 of the photodetector 503.

The photodetector 503 may include a variety of shapes, including polygonal and circular. In a specific embodiment, the photodetector 503 is rectangular. In some embodiments, the electrodes 509 are positioned in the corners of the photodetector. In some embodiments, the electrodes 509 are positioned at other positions away from the corners.

Figure 8:
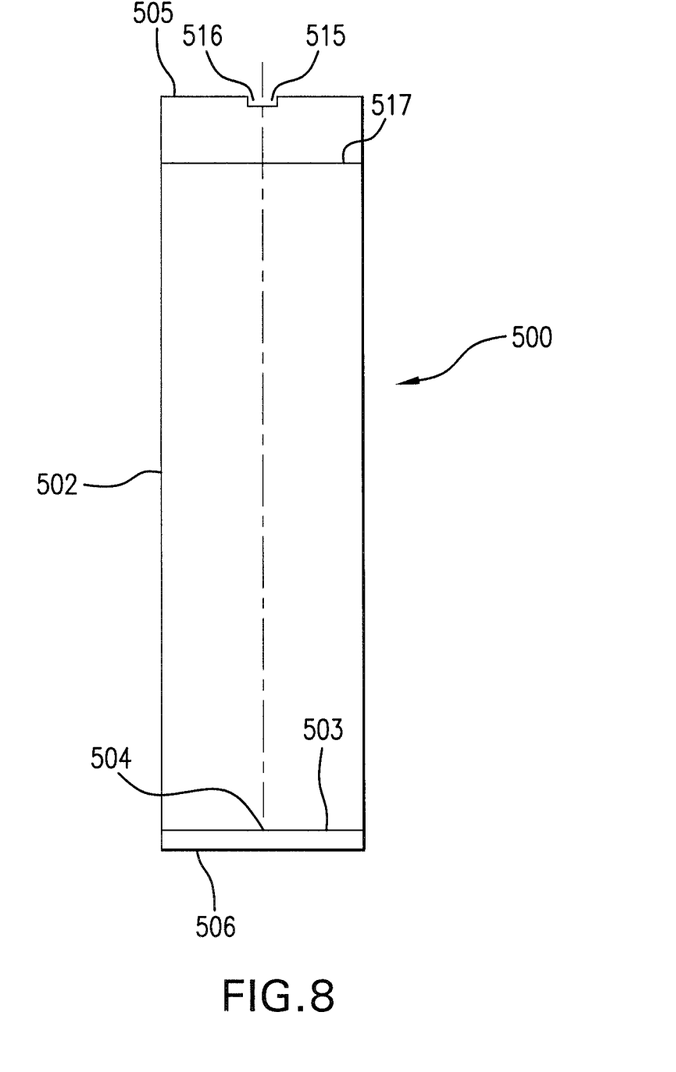
FIG. 8 is a schematic side view of an alignment device according to some embodiments of the present invention.

FIG. 8 illustrates an alignment assembly 500 according to some embodiments that includes a body 502 with a closed first end 505 and a second end 506. The first end 505 includes a narrow opening 515 that allows a narrow beam of light to reach a photodetector 503 at the second end 506 when the assembly 500 is oriented towards the sun. The first end 505 and the photodetector 503 may be aligned perpendicular to a longitudinal axis of the body 502. The size of the opening 515 affects an amount of light that reaches the photodetector 503. If no intermediate devices (e.g., lens, filter) are positioned between the opening 515 and the photodetector 503, the size of the opening 515 defines a size of the light spot on the photodetector 503. A field of view is determined by the length of the body 502 between the opening 515 and the photodetector 503 and an in-plane detector size. The field of view determines an extent of misalignment that can be detected by the assembly 500. The size of the light spot on the photodetector 503 may affect the accuracy. When the light spot is too big, the size will narrow the real field of view. According to some embodiments of the present invention, the light passes through a lens 501 prior to reaching the photodetector 503 (e.g., the lens 501 may be positioned at the opening 515). A diameter of the lens 501 defines how much light is collected, and the focal length of the lens determines the size of the light spot.

Incoming beams shine through the opening 515 and strike the photodetector 503 when the assembly 500 is generally aligned with the sun. During misalignment, the incoming beams strike against the walls of the body 502 and do not reach the photodetector 503. The inner walls of the body 502 may be configured to prevent reflection of the incoming beams.

A light-transmissive cover 516 may extend across the opening 515. The cover 516 prevents water or other contaminants such as insects, plant matter, and the like from entering into an interior of the body 502. A filter 517 may further extend across the body to reduce the light intensity that reaches the photodetector 503 from exceeding a saturation threshold. The photodetector 503 is configured to determine the location of incidence 504 of a light beam that enters through the opening 515.

Figure 9:
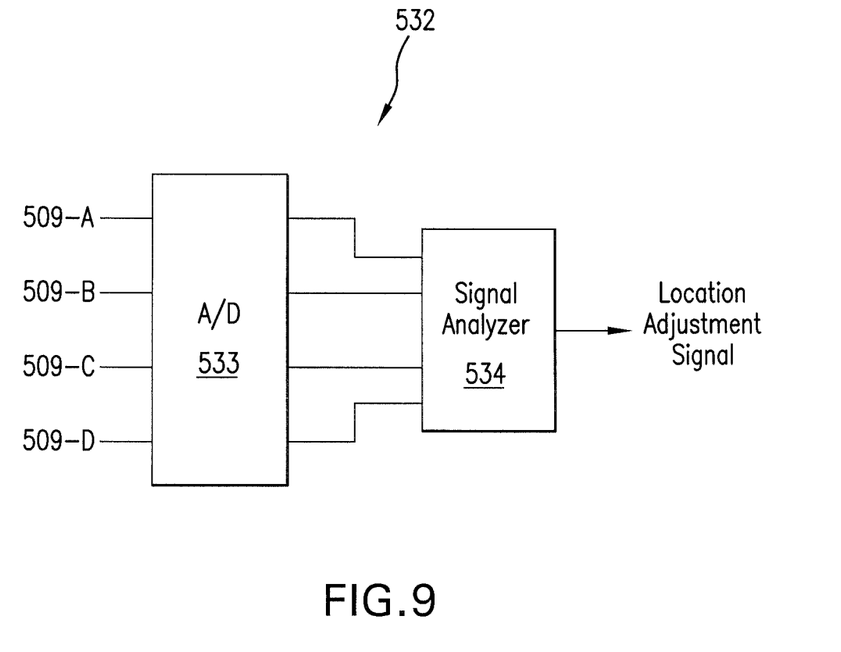
FIG. 9 is a schematic illustration of a circuit for analyzing the electrode signals generated by a photodetector in an alignment device according to some embodiments of the present invention.

FIG. 9 illustrates an embodiment of a circuit 532 for analyzing the electrode signals generated by the photodetector 503. The circuit 532 includes an A/D (analog-to-digital) converter 533 for digitizing the electrode signals and a signal analyzer 534 for generating a location adjustment signal based on the digitized electrode signals output by the ND 533. The signal analyzer 534 can be a micro-controller, a processor such as a general purpose processor or DSP (digital signal processor), an ASIC (application-specific integrated circuit) or any other suitable digital logic type device. The signal analyzer processes the digitized electrode signals and generates the location adjustment signal which can indicate the X-Y position of the location of incidence 504, an X-Y offset from the center 505 of the photodetector 503 or other information relating to the position of the location of incidence 504. The signal analyzer 534 can determine the location adjustment signal e.g. using well-known linear equations, accessing a lookup table that translates each unique combination of electrode signals to an X-Y position or X-Y offset, or by implementing any other suitable type of signal processing algorithm. In another embodiment, an amplifier such as an operational amplifier can be coupled to each electrode 509 for amplifying the respective electrode signals into an amplified voltage signal which can then be processed in the digital domain as explained above or in the analog domain, e.g. using comparators, etc. In each case, information relating to the position at which incident light strikes the photodetector 503 is available for further processing or use.

The number of alignment assemblies 500 on the array 100 may vary. According to some embodiments of the present invention, a separate alignment assembly 500 is associated with each module 200 as illustrated in FIG. 3. Other embodiments may include fewer alignment assemblies 500. In one specific embodiment, a single alignment assembly 500 is associated with the array 100. In another embodiment, each discrete section of the torque tube 120 includes an alignment assembly 500. In another embodiment, alignment assemblies 500 are positioned at intervals away from the drive 170. By way of example, an alignment assembly 500 may be positioned at each 10 foot interval away from the drive 170. In some instances, the torque tube 120 may experience axial deformation that varies dependant upon the distance along the axis A away from the drive 170. Alignment assemblies 500 spread along the length of the torque tube 120 may detect for these deformations.

The alignment assemblies 500 may attach to different positions on the modules 200. The assemblies 500 may be attached with the longitudinal axis of the body 502 perpendicular to the planar surface 209 of the module 200. This may also position the photodetector 503 parallel to the planar surface 209. According to some embodiments of the present invention, the assemblies 500 are positioned with the first end 502 either flush with or recessed below the planar surface 209 of the module 200.

Controller 190 processes the signals and determines an amount and direction of movement of the modules 200 necessary for proper alignment with the sun. The controller 190 may activate one or both drives 170, 180 as necessary to align the modules 200 with the sun. Once aligned, the controller 190 may then continue to move the modules 200 according to a preset program stored in memory to track the sun.

According to some embodiments of the present invention, the alignment assembly 500 periodically determines the alignment of the array 100. In other embodiments, the alignment assembly 500 continuously monitors the alignment of the array 100. The signal analyzer associated with the alignment assembly 500 may continuously send the signals to the controller 190, or may send the signals on a regular, intermittent basis.

According to some embodiments, the controller 190 may adjust the alignment of the array 100 at the time the signals are received from the alignment assemblies 500. In some embodiments, the controller 190 does not adjust the alignment of the array 100 until the amount of misalignment exceeds a predetermined amount.

With regard to the adjustment of the modules 200 about the torque tube 120 and the A axis, the controller 190 may take a combination of the readings from different alignment assemblies 500 and adjust the torque tube 120 accordingly.

With regard to adjustment of the modules 200 about the B axes, in some embodiments with multiple alignment assemblies 500, the controller 190 may receive separate signals from each assembly 500 and adjust each of the associated modules 200 accordingly around the axis B. In some embodiments with multiple alignment assemblies 500, the controller 190 may factor in the misalignment amounts from each assembly 200 and adjust each module 200 an equal amount about the axes B.

The controller 190 may store the misalignment information in memory for maintenance of the array 100. A misalignment beyond a predetermined amount or continuous misalignment may require re-programming of the controller 190, replacement of one or more components in the array 100 that are causing the misalignment, or both.

According to some embodiments of the present invention, the alignment assembly 500 is permanently mounted to a module 200 or other section of an array 100. In other embodiments, the alignment assembly 500 is portable. The portability provides for an alignment assembly 500 to be used with multiple different modules 200 and/or arrays 100. The alignment assembly 500 may be temporarily attached to a module 200 or array 100 to take an alignment reading. Once completed, the alignment assembly 500 can be removed and used at a different location. The alignment assembly 500 may be attached to a specific location for an extended period of time to take readings throughout the period, or may be attached for a limited period of time. According to some embodiments of the portable alignment assembly 500, the assembly 500 may be operatively attached to the mechanism that adjusts the module 200 or array 100. In other embodiments, the alignment assembly 500 provides an output that can then be used by an operator to make the necessary adjustments.

Figure 10:
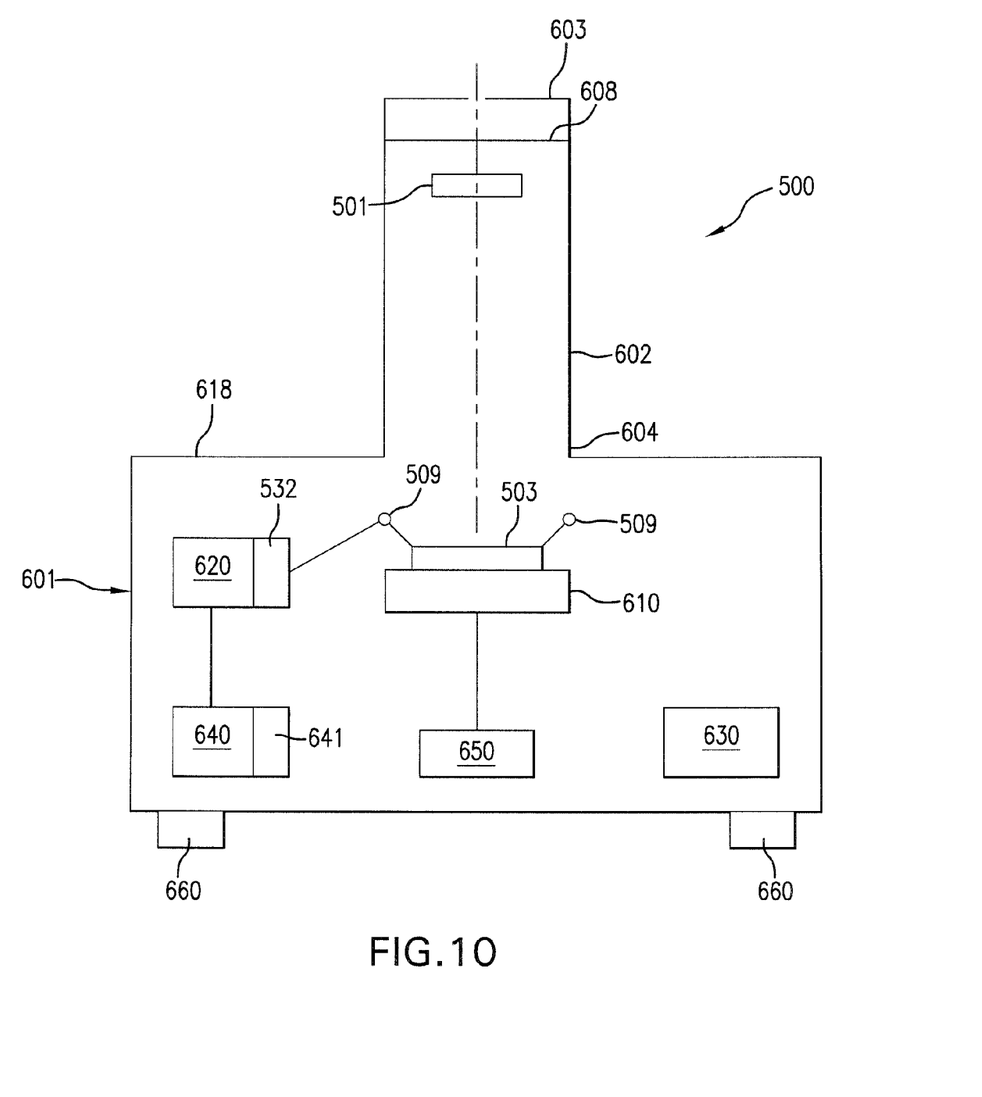
FIG. 10 is a schematic illustration of an alignment assembly according to some embodiments of the present invention.

FIG. 10 illustrates an embodiment of a portable alignment assembly 500. The assembly 500 includes a housing 601 that has a base 618 and an elongated tube 602. The housing 601 may be a single piece construction, or may be multiple pieces that are attached together. According to some embodiments, the housing includes two pieces with the base 618 being a first piece that is connected to the tube 602 which is the second piece. The housing 601 is sized to be portable to be used at various different locations.

The tube 602 includes a first end 603 positioned away from the base 618 and a second end 604 at the base 618. A lens 501 is positioned at the first end 602 and is shaped and configured to focus incoming rays of the sun into a focused beam. The length of the tube 602 measured between the first and second ends 603, 604 may vary. The tube 602 includes a longitudinal axis that extends along the length and through the first and second ends 603, 604.

The photodetector 503 is positioned within the housing 601 and aligned along the longitudinal axis of the tube 602. The photodetector 503 may be located in the tube 602, or may be located in the base 618. A support 610 may be positioned in the housing 601 to locate the photodetector 503 relative to the lens 501. According to some embodiments of the present invention, the photodetector 503 is positioned away from the lens 501a distance equal to a focal length of the lens 501. In other embodiments, the photodetector 503 is positioned a different distance away than the focal length. The photodetector 503 includes a plurality of leads 509 as discussed above that generate signals indicative of a position of the focused beam on the photodetector 503.

A controller 620 is positioned in the housing 601 to control the operation of the alignment assembly 500. The controller 620 may include a microcontroller with associated memory, and may further include a circuit 532 for analyzing the electrode signals generated by the photodetector 503. In some embodiments of the present invention, the controller 620 may include a microprocessor, random access memory, read only memory, and an input/output controller associated with a display 640. The controller 620 is operatively connected to the plurality of leads 509 and is configured to analyze the signals and determine a location of incidence 504 of the focused beam on the photodetector 503. The controller 620 may further be configured to determine a distance and direction between the location of incidence 504 and a predetermined point on the photodetector 503, such as a center point.

A display 640 is positioned on the housing 601 to display information concerning the location of incidence 604 of the focused beam on the photodetector 503. The display 40 is positioned on the housing 601 in a location easily accessible and visible by an operator. According to some embodiments of the present invention, the display 640 is embodied as an alphanumeric LCD display. The display 640 may also include a control panel 641 for the operator to enter commands and generally control the operation of the alignment assembly 500. In some embodiments of the present invention, the display 640 includes a keypad for entering commands that are processed by the controller 620. In some embodiments, the display 640 includes a composite touch screen that simultaneously displays relevant information, including images, while accepting user input commands by finger touch or with the use of a stylus pen.

According to some embodiments of the present invention, the display includes a plurality of menu options that can be selected by the operator. The menu items provide for operating the various tasks necessary for determining the alignment. Examples of menu items may include alignment of the alignment assembly 500 during initial attachment to the module 200 or array 100, obtaining test results to determine alignment, and adjustment requirements for the module 200 or array 100. Each menu may include multiple screens with multiple input options that are selected and input by the user as necessary.

The alignment instrument 500 may further include a battery 630 that is positioned in the housing 601. The battery 630 supplies power to at least the photodetector 503, the controller 620, and the display 640.

One or more attachment mechanisms 660 are associated with the housing 601 for positioning and mounting the alignment assembly 500. An alignment mechanism 650 may be operatively connected to the controller 620 to position the alignment assembly 500. According to some embodiments of the present invention, the alignment mechanism 650 is a level to determine the relative position of the assembly 500 in one or more dimensions.

According to some embodiments of the present invention, one or more intermediate focusing elements may be positioned between the lens 501 and the photodetector 503. One or more filters 608 may be positioned to control the saturation level of the incoming light beams. One or more of the filters 608 may be a color filter adjust the light intensity and reduce achromatic distortions. One or more of the filters 608 may also be gray (neutral density) filters.

According to some embodiments of the present invention, the portable alignment assembly 500 may also include the same structure as the assembly 500 illustrated in FIG. 8. The portable assembly 500 may include an opening at the first end 603 that allows a beam of light to enter into the tube 602 and strike the photodetector 503.

The photodetector 503 may include a single semiconductor device that receives the beam of light and produces one or more signals indicative of the location of the beam. In some embodiments of the present invention, the photodetector 503 includes multiple separate semiconductor devices that are operate in combination. In one specific embodiment, the photodetector 503 includes four separate semiconductor devices that are abutted together to form a single planar photodetector configuration.

The embodiments described above include one or more photodetectors 503 that form the planar arrangement for detecting the location of incidence 504. In other embodiments, one or more thermo-sensor devices are used for determining the location of the beam. These devices determine the location based on localized heating. Examples include an array of thermocouples, an array of thermo-electric modules, and other thermal sensors. Other embodiments may include various sensors that are capable of producing a signal proportional to a linear shift.

The signals at each electrode 509 may also depend on the total light intensity. According to some embodiments of the present invention, the circuit analyzing the electrode signals is capable of normalizing the signal to the total illumination. The circuit may be a fully analog system that processes the calculations. In one embodiment, the analog system includes a set of amplifiers and a signal divider chip. In one embodiment, a digital voltmeter is used to display angular values.

The various alignment devices 500 may be used for both mounted and portable applications. By way of example, the alignment device 500 illustrated in FIG. 6 may be permanently mounted to a solar cell module 200 or other section of an array 100. Alternatively, the alignment device 500 of FIG. 6 may also be configured for use in a portable manner. Further, an array 100 may use different types of alignment devices 500. By way of example, an array 100 may include one or more permanently mounted alignment devices 500 mounted to the solar cell modules 200. The same array 100 may also use one or more portable units for additional alignment aspects.

According to some embodiments of the present invention, the various mounted and portable alignment devices 500 include a common construction and common components. The commonality simplifies the transfer of calibration parameters between alignment devices 500. In one specific embodiment, each alignment device 500 includes a lens with the same electronic components for determining alignment.

In one embodiment, the array 100 can be installed in a straight-forward manner. The various components are sized to fit within a standard vehicle and are light-weight to allow installation by a single person or limited number of persons.

Further, the modular aspect of the array 100 facilitates modifications after the initial installation. Additional sections 121 and vertical supports 130 may be added to the frame 110 to accommodate a desired number of additional modules 200. Further, the size of the array 100 may be reduced after installation by removing one or more solar cell modules 200.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

Without further analysis, from the foregoing others can, by applying current knowledge, readily adapt the present invention for various applications. Such adaptations should and are intended to be comprehended within the meaning and range of equivalence of the following claims.

What is claimed is:

1. An alignment test instrument for a solar tracking photovoltaic system that includes a plurality of planar solar cell modules each having a planar surface, the alignment test instrument comprising:

an alignment device mounted on at least one of the plurality of planar solar cell modules so that an axis of the device is substantially perpendicular to the planar surface of the module, the device including a convex lens at one end for focusing incoming rays of the sun into a focused beam, and a planar photodetector at a second end positioned so that the focused beam aligns on at a location of incidence, wherein the location of incidence aligns with a predetermined point of the photodetector when the modules are correctly aligned; and a plurality of leads attached to the photodetector to provide a signal indicative of an angular misalignment of the at least one module, wherein the signal is configured to provide the location of incidence on the planar photodetector.

2. The alignment test instrument of claim 1, wherein the planar photodetector is configured so that the predetermined point of the photodetector is a center of the photodetector.

3. The alignment test instrument of claim 1, wherein the photodetector has a polygonal shape with each corner including one of the plurality of leads.

4. The alignment test instrument of claim 3, wherein the photodetector has a rectangular shape with four leads attached to the corners of the photodetector.

5. A portable alignment test assembly for use with a solar cell module that has a planar surface, the alignment test instrument comprising:
- a housing including a base and an elongated tube that extends outward from the base and terminates at a distal end, the tube including a longitudinal axis that extends through the distal end;
- a first lens positioned at the distal end of the tube to focus incoming rays of sun into a focused beam;
- a planar detector positioned within the housing and aligned with the longitudinal axis of the tube to receive the focused beam;
- a plurality of leads attached to the planar detector with each of the plurality of leads generating a signal indicative of a position of the focused beam on the planar detector;
- a controller positioned within the housing and operatively connected to the plurality of leads, the controller configured to analyze the signals generated by each of the plurality of leads and determine a location of incidence of the focused beam on the planar detector;
- a display on the housing operatively connected to the controller to display information concerning the location of incidence of the focused beam on the planar detector; and
- a battery positioned within the housing to supply power to at least the planar detector, the controller, and the display.

6. The alignment test instrument of claim 5, further comprising a second lens positioned in the tube between the first lens and the planar detector to further focus the focused beam.

7. The alignment test instrument of claim 5, further comprising an alignment mechanism positioned within the housing to align the housing relative to the solar cell module, and an attachment mechanism to attach the housing relative to the solar cell module.

8. The alignment test instrument of claim 5, wherein the planar detector includes a shape with a plurality of corners with a different one of the plurality of leads connected to each of the plurality of corners.

9. The alignment test instrument of claim 5, wherein the base is a separate element that is fixedly connected to the tube.

10. A terrestrial solar tracking photovoltaic array comprising:
- a torque tube positioned above a ground surface extending along a tube axis;
- a first drive operatively connected to the torque tube to rotate the torque tube about the tube axis;
- a plurality of vertical supports spaced along a length of the torque tube and configured to support the torque tube above the ground surface, the torque tube being journaled for rotation about the tube axis;
- at least one solar cell module pivotally coupled to the torque tube to allow each of the at least one solar cell module to track the sun during the course of the day, each of the at least one solar cell module including a planar surface; and
- a sun alignment sensor coupled to the at least one solar cell module to determine an angular displacement of the planar surface of the solar cell module with respect to incoming beams from the sun.

11. The terrestrial solar tracking photovoltaic array of claim 10, wherein the torque tube includes a plurality of discrete elongated sections that are attached together in an end-to-end configuration.

12. The terrestrial solar tracking photovoltaic array of claim 10, wherein the sun alignment sensor includes a body with a first end having a lens and a second end spaced apart from the first end and having a planar photodetector, each of the lens and the photodetector being positioned perpendicular to a longitudinal axis of the body.

13. The terrestrial solar tracking photovoltaic array of claim 12, wherein the lens and the photodetector are configured so that the incoming beams align on a center of the photodetector when the at least one solar cell module is correctly aligned with respect to the sun.

14. The terrestrial solar tracking photovoltaic array of claim 12, wherein the photodetector has a polygonal shape with each corner including an electrical lead.

15. The terrestrial solar tracking photovoltaic array of claim 14, wherein the photodetector has a rectangular shape with each of the four corners having one of the electrical leads and a circuit for analyzing signals generated by each of the electrical leads and determining a distance between a location of incidence and a predetermined point on the photodetector.

16. The terrestrial solar tracking photovoltaic array of claim 12, wherein the photodetector includes a PN junction for generating a photocurrent responsive to the incoming beam striking the photodetector.

17. The terrestrial solar tracking photovoltaic array of claim 10, wherein each of the at least one solar cell module is pivotally coupled to the torque tube to be rotatable about a pivot axis perpendicular to the tube axis.

18. The terrestrial solar tracking photovoltaic array 10, wherein the sun alignment sensor includes a body with a first end having an opening and a second end spaced apart from the first end and having a planar photodetector, each of the opening and the photodetector being positioned perpendicular to a longitudinal axis of the body.

19. The terrestrial solar tracking photovoltaic array of claim 18, further comprising a filter extending across the longitudinal axis of the body to reduce a light intensity of the incoming beam reaching the photodetector to below a saturation threshold of the photodetector.

20. The terrestrial solar tracking photovoltaic array of claim 10, further comprising a controller that receives signals from the sun alignment sensor and rotates the torque tube to align the modules relative to the sun.

* * * * *